United States Patent
Marek et al.

(10) Patent No.: US 9,625,554 B2
(45) Date of Patent: Apr. 18, 2017

(54) ELECTRONIC INTERFACE FOR NMR RECEIVER RESONATORS

(71) Applicant: Bruker BioSpin AG, Faellanden (CH)

(72) Inventors: Daniel Marek, Schwerzenbach (CH); Arthur Schwilch, Uster (CH); Martin Luke, Faellanden (CH)

(73) Assignee: Bruker BioSpin AG, Faellanden (CH)

( * ) Notice: Subject to any disclaimer, the term of this patent is extended or adjusted under 35 U.S.C. 154(b) by 971 days.

(21) Appl. No.: 13/847,501

(22) Filed: Mar. 20, 2013

(65) Prior Publication Data

US 2013/0249558 A1    Sep. 26, 2013

(30) Foreign Application Priority Data

Mar. 26, 2012   (DE) .................. 10 2012 204 798

(51) Int. Cl.
   *G01R 33/58*  (2006.01)
   *G01R 33/36*  (2006.01)

(52) U.S. Cl.
   CPC ......... *G01R 33/58* (2013.01); *G01R 33/3628* (2013.01); *G01R 33/3657* (2013.01)

(58) Field of Classification Search
   CPC . G01R 33/58; G01R 33/3628; G01R 33/3657
   See application file for complete search history.

(56) References Cited

U.S. PATENT DOCUMENTS

| 6,850,067 | B1 | 2/2005 | Burl |
| 7,002,348 | B2 | 2/2006 | Kwok |
| 7,723,988 | B2 | 5/2010 | Schwilch |
| 7,999,548 | B1* | 8/2011 | Brown ................... A61B 5/055 324/307 |
| 8,159,222 | B2* | 4/2012 | King .................. G01R 33/3415 324/307 |

(Continued)

FOREIGN PATENT DOCUMENTS

EP    0 315 382    5/1989

OTHER PUBLICATIONS

J. Wosik et al., "Cryogenic Varactor-Tuned 4-element Array and Cryostat for μ-MRI of Trabecular Bone in the Distal Tibia", Proc. Intl. Soc. Mag. Reson. Med. 16(2008).

(Continued)

*Primary Examiner* — Dixomara Vargas
(74) *Attorney, Agent, or Firm* — Paul Vincent (57) ABSTRACT

An electronic interface (10) between a pure NMR receiver resonator (RO) and a preamplifier is characterized in that one or more control diodes ($D_{match1}$, $D_{tune1}$) are provided by means of which the current designed to flow through the switching diodes can be fed into these switching diodes, and the control diodes are connected to the switching diodes directly or via one or more additional series impedances. In this fashion, the impedance of the resonator is transformed to the required preamplifier or line impedance during the receiving process with little loss. In particular, during the receiving process, matching can be adjusted during the transmitting process, the current in the inductance of the resonator generated by the $B_1$ field of the transmitting resonator is minimized and all components are protected against damage.

12 Claims, 4 Drawing Sheets

10

(56) References Cited

U.S. PATENT DOCUMENTS

| | | | |
|---|---|---|---|
| 8,228,062 B2 * | 7/2012 | Sharp | G01R 33/3415 |
| | | | 324/309 |
| 9,417,299 B2 * | 8/2016 | Reykowski | G01R 33/3415 |
| 2003/0080801 A1 | 5/2003 | Viti | |
| 2003/0173966 A1 | 9/2003 | Scott | |
| 2003/0189426 A1 | 10/2003 | Kwok | |
| 2011/0187371 A1 | 8/2011 | Takegoshi | |

OTHER PUBLICATIONS

B.L. Beck et al., "High Q Reactive Network for Automatic Impedance Matching", Proc. Intl. Soc. Mag. Reson. Med. 19(2011).
P.B. Roemer et al., "The NMR Phased Array", Magnetic Resonance in Medicine 16, 192-225 (1990).

\* cited by examiner

ELECTRONIC INTERFACE FOR NMR RECEIVER RESONATORS

This application claims Paris convention priority of DE 10 2012 204 798.0 filed Mar. 26, 2012 the entire disclosure of which is hereby incorporated by reference.

BACKGROUND OF THE INVENTION

The invention concerns an electronic interface between an NMR receiver resonator and at least one preamplifier for transforming the impedance of the NMR receiver resonator to the preamplifier during the receiving process and for opening or detuning the NMR receiver resonator during the transmitting process using one or more switching diodes with a current flowing through them. Within the context of the present invention, the phrase "transforming the impedance" assumes the conventional meaning in the art, namely "tuning and matching the impedance".

A configuration of this type is disclosed in the article "Cryogenic Varactor-Tuned 4-element Array and Cryostat for p-MRI of Trabecular Bone in the Distal Tibia" by J. Wosik, K. Nesteruk, M. R. Kamel, F. Ip1, L. Xue, A. C. Wright, and F. W. Wehrli in Proc. Intl. Soc. Mag. Reson. Med. 16 (2008) (=reference [1]).

Resonators are often used in NMR and, in particular, in MRI for receiving radio frequency signals. These are often also designed in the form of so-called receive-only resonators (RO resonators). As the name suggests, resonators of this type are exclusively used for the receiving process of NMR signals. Nuclear spins are excited during the transmitting process by an additional separate transmitting resonator (TX resonator). This type of configuration is particularly suited for realizing arrays of RO resonators in MRI [4]. For operation, the RO resonator must be connected to a preamplifier for signal processing and amplification. With the type of construction discussed here, this is realized by means of an electronic interface. The electronic interface for such an RO resonator must meet four main objectives:

First: The output impedance (A1, A2 in FIG. 1) of the RO resonator must be transformed to a defined second impedance (points P1, P2 in FIG. 1) with as little loss as possible, i.e. a power and noise matching must be realized, or a trade-off between these. This is realized with or without an intermediate transmission line. This impedance transformation is generally called "matching".

Second: Due to the resonance property of the resonator, matching can only be performed at a certain frequency. For this reason, it must be possible to adjust the resonance frequency to the frequency co of the NMR signals. This frequency adjustment is generally called "tuning".

The combination of the two above-mentioned terms is also often referred to as "impedance matching" or also only "matching".

Third: Due to the practically unavoidable coupling between the RO resonator and the TX resonator, a voltage is induced in the inductance L (see FIG. 1) of the RO resonator during the transmitting process. Without taking further measures, this would result in a resonant and therefore very high induced current in L which would have negative retroactive effects on the $B_1$ field of the NMR configuration in the surroundings of the RO resonator. In order to prevent this, the RO resonator must be "detuned" during the transmitting process. This process, which is generally called "detuning", can be realized by "opening" the RO resonator, i.e. by connecting such an additional impedance (typically an inductance) in parallel with C such that the resulting overall impedance at the connections (A1, A2 in FIG. 1) of L becomes very high (parallel resonant circuit of C and of the additional impedance) in comparison with $\omega L$. For this reason, an induced voltage in L generates only a negligible current in this L and therefore in the RO resonator.

However, there are also configurations which merely shift the resonance frequency of the RO resonator (according to [2] and [3]) instead of opening the RO resonator (according to [1]), which results in a reduced but still significant induced current in the RO resonator during the transmitting process.

Fourth: It must thereby be taken into consideration that, in the transmitting case, the electronic interface itself as well as the downstream preamplifier must be protected from being damaged.

Impedance transformation of an RO resonator upon load change during operation (typically caused by a change of loading by the object to be measured (=sample) in that the position, size or also radio frequency properties change while the sample remains the same or when the sample is changed) can be realized in a simple and very elegant fashion by using varactor diodes instead of fixed capacitors or mechanical trimmers. Their capacitance can be electronically varied by a direct voltage.

Figure 4:
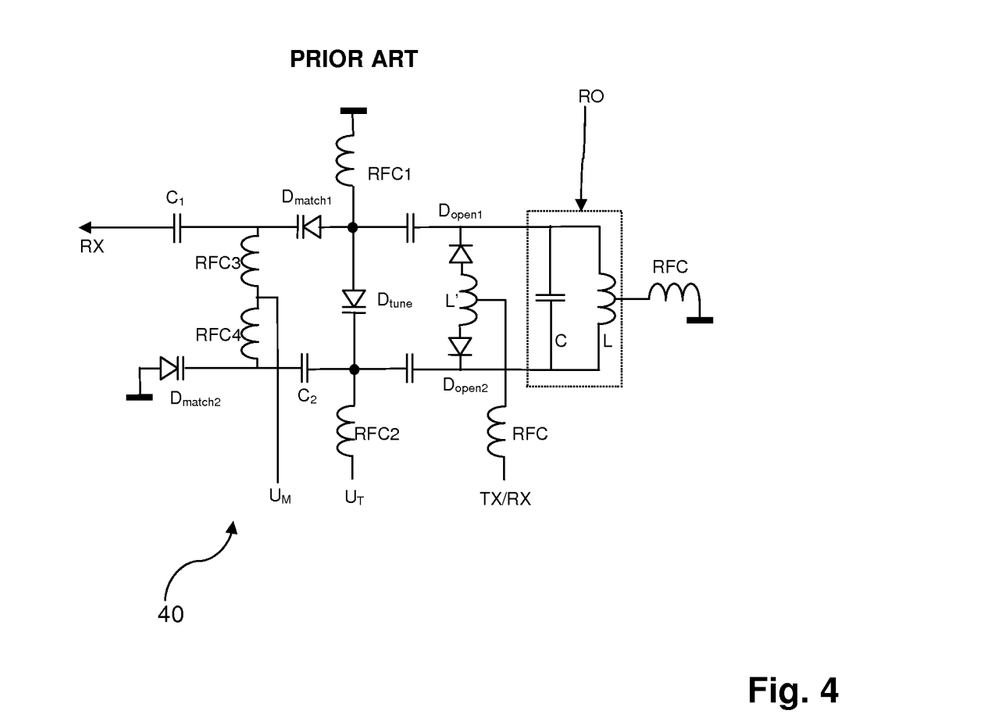
FIG. 4 shows an electronic interface according to prior art in accordance with reference [1].

Conventional devices as described e.g. in [1] consist of an electronic network of varactor diodes, PIN diodes, inductances and capacitances. FIG. 4 shows a diagram of such a configuration with the electronic interface 40. Tuning of the RO resonator is adjusted by means of a varactor diode ($D_{tune}$) and a corresponding DC voltage $U_T$. The DC potential is supplied to the varactor diode via two chokes (RFC1, RFC2). Matching in this configuration is realized via two further varactor diodes ($D_{match1}$, $D_{match2}$) which are driven by a DC voltage $U_M$. The DC potential is again supplied via two chokes (RFC3, RFC4).

It is desirable to maintain the potentials as symmetrical as possible with respect to the radio frequency ground in order to minimize capacitive fault currents and therefore undesired couplings with neighboring RO resonators. "Symmetrical" means in general an antisymmetric potential such that there are no potentials at the symmetry points, which could cause common mode currents.

Figure 1:
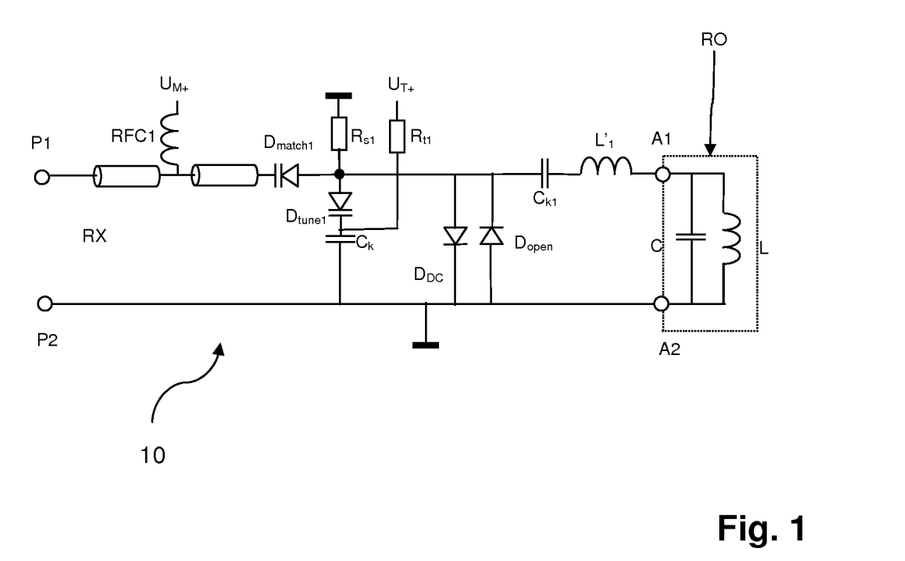
FIG. 1 shows a schematic circuit diagram of a particularly simple variant of the inventive device.

For example, the inventive configuration in FIG. 1 is not symmetrical in this sense. The conventional configuration of FIG. 4 is symmetrical only to a limited extent since the connection to the preamplifier (RX) is realized in an asymmetrical fashion. The configurations of FIG. 2 or 3, however, are largely symmetrical.

According to prior art in accordance with document [1], the resonant circuit is opened via two PIN diodes ($D_{open1}$, $D_{open2}$. The inductor L' is thereby connected in parallel with the capacitor C of the RO resonator. With regard to the inductance L of the RO resonator, the connected circuit (parallel resonant circuit L' and C) then appears to have a considerably higher impedance (in comparison with the impedance $\omega L$) with the consequence that nearly no current can flow through the inductance L and for this reason, the RO resonator seems to be "open".

This conventional configuration in accordance with FIG. 4 has the following disadvantages:

1. The chokes (RFC1, RFC2) of this configuration are provided directly at the two points of the RO resonator and additionally damp it, which can considerably decrease the sensitivity, in particular, for RO resonators with very high Q values (in particular for a cryogenically cooled or even superconducting RO resonator [1]). However, reference [1] precisely concerns a cryogenic resonator with HTS coils which nevertheless have a very high Q value and for this reason are very sensitive to undesired damping through switching.

2. Due to the current flow through the PIN diodes, a DC current flows through the inductance L of the RO resonator to ground. This current locally generates a $B_0$ inhomogeneity around the resonator, which can have a disturbing effect in NMR and MRI.

3. A configuration of this type does not offer sufficient protection against damage to the varactor diodes. When the external $B_1$ field is strong, a high voltage is induced in the inductance L of the RO resonator, the main part of which is directly across the diode $D_{tune}$ and slightly attenuated at the diodes $D_{match1}$ and $D_{match2}$.

In another configuration as described e.g. in reference [2] (not shown in the present figures), electronic matching is also achieved using varactor diodes. This configuration also has disadvantages:

1. In this case, the control signals are also connected to points with high impedance via chokes, which consequently damps the RO resonator during the receiving process.

2. The RO resonator is not opened during the transmitting process rather its resonance frequency is merely shifted. In consequence thereof, during the transmitting process, a considerable undesired current still flows through the inductances due to the induced voltage in the inductances $L_{coil}$ of the RO resonator, thereby also retroactively impairing the $B_1$ field.

One further configuration in accordance with reference [3] (which is not shown in the figures either) shows a symmetrical circuit. This configuration, however, also has serious drawbacks:

1. The circuit offers no effective precautionary measures for opening the resonator but only detunes it such that significant currents still flow in the receiving coil during a transmitting process.

2. Moreover, none of the varactor diodes are protected against excess voltages and are destroyed above a certain induced voltage in the receiving coil.

As already stated in the title of the document, the function of the overall configuration therefore only consists in tuning the transmitting coil, wherein only low power levels are used and tolerated. The circuit does not offer any protection against transmitting power of the TX resonator and for this reason seems to be unsuitable for actual operation.

One further configuration in accordance with reference [5] (which is not illustrated in the figures either) describes a passive detuning circuit with improved linearity. This configuration does not need any external bias current for detuning. The bias current is obtained through rectification from the RF signal induced in the RO resonator by the TX resonator. The configuration has, however, the following disadvantages:

1. Detuning does not function for very small transmitting signals and the RO resonator couples with the TX resonator.

2. The configuration has no impedance transformation for matching to the preamplifier, which requires a separate solution. In the proper sense, the configuration is therefore not an interface between RO resonator and preamplifier.

In contrast thereto, it is the underlying purpose of the present invention to improve a device of the above-described type with inexpensive and as simple technical means as possible in such a fashion that the impedance of the RO resonator is transformed to the required preamplifier or transmission line impedance with minimum loss during the receiving process. The further required conditions (see above point "second" to "fourth") should thereby be met.

The matching should, in particular, be capable of being adjusted during the receiving process and the current in the inductance of the RO resonator generated by the $B_1$ field of the transmitting resonator should be minimized and all components should be protected against destruction during the transmitting process.

SUMMARY OF THE INVENTION

This complex task is achieved in a surprisingly simple and yet effective fashion in that one or more control diodes are provided by means of which the current designed to flow through the switching diodes can be fed into these switching diodes, wherein the control diode(s) is/are connected to the switching diodes directly or via one or more additional series impedances.

This achieves low-loss matching, wherein the other requirements ("second" to "fourth") are also met.

In one particularly preferred embodiment of the invention, one or more of the switching diodes are designed as PIN diodes. This is advantageous in that detuning is independent of the transmitting power since the PIN diode for the RF signal acts as a very small, linear resistance.

Particularly advantageous embodiments of the inventive electronic interface are characterized in that one or more of the control diodes are designed as varactor diodes and are connected in such a fashion that they are conductive during the transmitting process and act as a capacitance during the receiving process. This enables, by means of the same control signals, opening of the RO resonator and also, by reversing the polarity of the control signals, transformation of the impedance of the RO resonator to the preamplifier as well as tuning of the resonance frequency.

In advantageous further developments of these embodiments, at least one of the varactor diodes ($D_{match1}$, $D_{match2}$) is designed in such a fashion that it can be used for matching. As a result, the impedance of the RO resonator is matched to the preamplifier.

Using other further developments of the above-defined embodiments, at least one of the varactor diodes can be used for tuning, whereby the resonance frequency of the RO resonator can be adjusted to the mid frequency of the NMR signals.

Further advantageous embodiments of the invention are characterized in that one or more further protective diodes are connected in an anti-parallel fashion with one or more switching diodes. This additionally protects the switching diodes from being overloaded, in particular, protects them against undesired DC potentials which can be generated by rectifying effects in the Pin diodes in case of high power levels.

In particularly advantageous embodiments of the inventive electronic interface, the device is designed symmetrically and therefore has two signal outputs in that the circuit is provided twice and all diodes of the second switching part have reversed polarities. Couplings to and from neighboring components are reduced in this fashion.

In preferred further developments of these embodiments, one or more of the series connected identical electronic components of the circuit are replaced by a single one of these components, thereby omitting the ground connection, which is advantageous in that fewer components of this type are required and the series loss resistances thereof are therefore smaller.

One class of further developments of the above defined embodiments is characterized in that one preamplifier is provided for each signal output. In this fashion, substantially stronger signals can be amplified without being distorted.

In one alternative class of further developments, the two signal outputs are designed in such a way that the signals are combined in a phase-correct fashion and are guided to only one preamplifier. This enables symmetrical design of the interface with as few active components as possible in the direct vicinity of the RO resonator.

The invention is also improved in that the varactor diodes and/or tuning diodes are multiplied by parallel or anti-parallel connections. In this fashion, the tuning and matching areas can be enlarged and/or adjusted to the respective RO resonator.

In particularly preferred embodiments, the inventive electronic interface is designed for operation at temperatures below 100 K such that the interface can be realized in the direct vicinity of the likewise cooled RO resonator, thereby increasing the sensitivity of the configuration.

Further advantages of the invention can be extracted from the description and the drawing. The features mentioned above and below may be used individually or collectively in arbitrary combination. The embodiments illustrated and described are not to be understood as an exhaustive enumeration but have exemplary character for describing the invention.

DESCRIPTION OF THE PREFERRED EMBODIMENT

Figure 2:
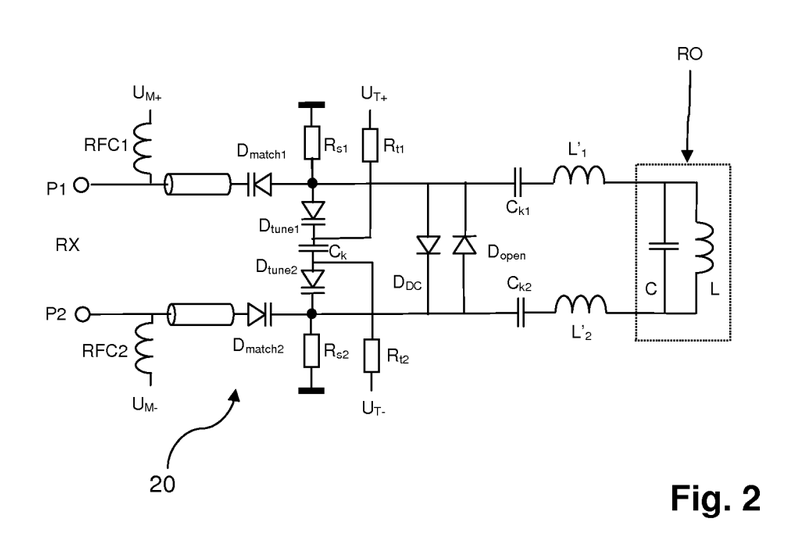
FIG. 2 shows a simple symmetrical embodiment of the inventive device.
Figure 3:
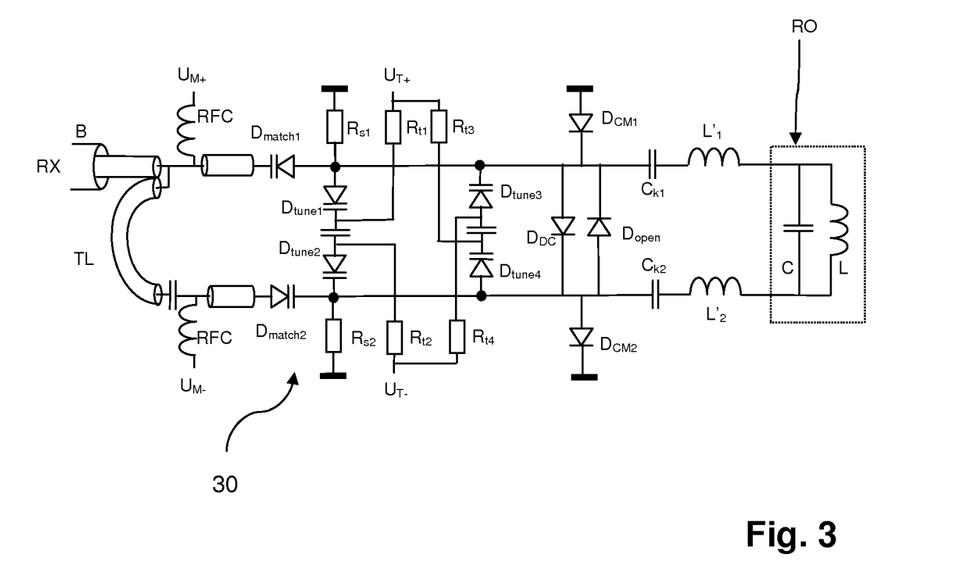
FIG. 3 shows a more comprehensive symmetrical variant of the inventive device.

FIGS. 1, 2 and 3 describe special embodiments of the invention.

FIG. 1 shows a simplified diagram of the inventive electronic interface 10. One particular feature is the low-loss feeding of the control signals for the varactor and PIN diodes at points with "low impedance", i.e. at points with a low RF impedance, as is explained below.

The RO resonator is tuned by means of a varactor diode $D_{tune1}$. The corresponding reverse voltage for controlling the capacitance of the varactor diode is fed via resistor $R_{t1}$. The capacitor $C_k$ is used as an RF short-circuit at the feeding point. This feeding therefore takes place at a point with low RF impedance and therefore hardly loads the RO resonator. Only the resistor $R_{s1}$ is connected at a point with high impedance of the RO resonator. The resistor $R_{s1}$ is only used to define the DC potential at the anode of $D_{tune1}$ and may therefore have a very high impedance (in the mega ohm range), whereby, however, the RO resonator is not significantly loaded.

Matching is realized by a further varactor diode $D_{match1}$. The reverse voltage $U_{M+}$ for controlling the capacitance of the diode is supplied from the low-impedance side (connection P1, P2, line to RX, e.g. 50 Ohm) via the chokes RFC1. This prevents additional loading of the RO resonator.

For opening the resonator, the switching diode $D_{open}$ generates a short-circuit, as a consequence of which the coil $L_1'$ is connected in parallel with C. A high-impedance parallel resonant circuit (L and C) is then connected to the inductance L of the RO resonator. Consequently, even when the external $B_1$ field which is caused by the transmitting resonator is strong, nearly no current flows in the coil L. For this reason, the $B_1$ field generated by the TX resonator is not influenced. The coupling capacitor $C_{k1}$, which is merely used for DC decoupling of the components located to its left-hand side in the figure, forms an RF short-circuit or can be offset with the inductance $L_1'$ and can be ignored in further RF considerations.

The best way of obtaining a current flow through the switching diode $D_{open}$ is to reverse polarity of the matching voltage $U_{M+}$. For this reason, a current flows through $D_{open}$, $D_{match1}$ and RFC1.

A current may also be made to flow through the varactor diode $D_{tune1}$ during the transmitting process by reversing the polarity of the tuning voltage, thereby effecting "opening" of the RO resonator.

Advantageously, a current flows through both varactor diodes during the transmitting process, which yields a maximum current at the diode $D_{open}$, which, for a PIN diode, leads to a lower RF resistance.

A current of many amperes can flow in the switching diode $D_{open}$ during the transmitting process. A PIN diode is generally used as a switching diode. Although a PIN diode is generally regarded as a controllable radio frequency resistance, a rectifying effect can occur starting from certain RF current strengths or when no control current is present, in particular, by charging the capacitor $C_{k1}$ to the peak value during the negative half wave. Accordingly, twice the peak voltage is applied across the diode $D_{open}$ during the subsequent positive half wave, which can destroy it. In order to prevent this, a protective diode $D_{DC}$ can be connected anti-parallel with the PIN diode $D_{open}$. In this fashion, the overall circuit is protected against destruction by large potentials even when absolutely no control current is present.

FIG. 2 shows a simple symmetrical design of the inventive electronic interface 20. It is generated by mirroring the circuit of FIG. 1 and was simplified in that the identical components, which are then connected in series, are replaced by one single component in each case, thereby omitting the ground connection.

Particular features are the low-loss feeding of the control signals for the varactor and switching diodes at low-impedance points, which also minimizes losses in this case, and the symmetry of the circuit, which minimizes (in particular capacitive) couplings to neighboring elements (e.g. further RO resonators).

The RO resonator is tuned by two varactor diodes $D_{tune1}$ and $D_{tune2}$. The corresponding reverse voltage for controlling the capacitance of the varactor diodes is fed via the capacitor $C_k$ which represents an RF short-circuit. Due to the symmetrical structure and RF short-circuit of $C_k$, feeding is realized at a low-impedance point with practically vanishing RF potential and therefore hardly loads the RO resonator. Only the two resistors $R_{s1}$ and $R_{s2}$ are connected to the high-impedance points of the RO resonator. They are only used to define the DC potential at the anode of $D_{tune1}$ or at the cathode of $D_{tune2}$ and can therefore have a very high impedance (in the mega ohm range), thereby preventing additional loading of the RO resonator.

Matching is realized by two further varactor diodes $D_{match1}$ and $D_{match2}$. The reverse voltages $U_{m+}$ and $U_{M-}$ for controlling the capacitance of the diodes are supplied from the low-impedance side (connections P1 and P2, line to RX, e.g. 50 Ohm) via two chokes RFC1, RFC2. This prevents additional loading of the RO resonator.

For opening the resonator, the switching diode $D_{open}$ generates a short-circuit and for this reason, the two coils (series connection of $L_1'$ and $L_2'$) are then connected in parallel with C. A high-impedance parallel resonant circuit ($L_1'+L_2'$ and C) is then connected to the inductance L of the RO resonator. Even when the external $B_1$ field is strong, caused by the transmitting resonator, hardly any current flows in the coil L. For this reason, the $B_1$ field generated by the TX resonator is not influenced.

The two coupling capacitors $C_{k1}$ and $C_{k2}$, which are only used for DC decoupling of the components arranged to their left-hand side, form an RF short-circuit or can be offset with the inductances $L_1'$ and $L_2+$ and can be ignored in further RF considerations.

The current flow through the switching diode $D_{open}$ is achieved by reversing the polarity of the matching voltage $U_{M+}$, $U_{M-}$. For this reason, a current flows through RFC2->$D_{match2}$->$D_{open}$->$D_{match1}$->RFC1. On the other hand, it is also possible to make a current flow through the two varactor diodes by reversing the polarity of the tuning voltage, thereby also effecting "opening" of the RO resonator.

In the transmitting case, a current advantageously flows through all varactor diodes, which yields a maximum current at the diode $D_{open}$.

FIG. 3 shows a more detailed variant of the inventive electronic interface 30.

The circuit can additionally be protected against other common-mode voltages that might occur by means of further diodes $D_{CM1}$, $D_{CM2}$. Their polarity may also be reversed compared to FIG. 3.

In order to increase the tuning range, further varactor diodes (not shown herein) may be connected directly in parallel with the existing ones ($D_{tune1}$, $D_{tune2}$) or also the entire branch can be implemented several times (parallel or anti-parallel in FIG. 3). Such a branch with varactor diodes $D_{tune3}$, $D_{tune4}$ which is connected anti-parallel with the first branch ($D_{tune1}$, $D_{tune2}$) also increases the linearity during the receiving process in addition to increasing the tuning range.

If, on the other hand, the tuning range and/or also the matching range shall be reduced, this can be achieved by additional parallel and/or series connections (thereby taking into consideration the DC potentials) of fixed capacitors (not illustrated in FIG. 3).

In correspondence with practice in MRI receiver systems, parts or the overall feed line may be provided with common mode filters (Balun B) in order to reduce undesired common mode currents in the feed lines.

Transmission to the preamplifier RX may be realized symmetrically or asymmetrically. In the latter case, a corresponding balancing unit is required (e.g. the line TL with 180° electrical length).

The overall circuit, which should be located in the direct vicinity of the RO resonator in order to prevent long transmission lines to the RO resonator and associated unnecessary RF losses, can be highly integrated (FIGS. 1 to 3) and be realized in a very small space, since chokes can be omitted, which would take up a great deal of space and for their part also could have undesired couplings to the TX resonator when no further countermeasures are taken. In this fashion, robust and efficient RO arrays can be realized.

The inventive electronic interface is particularly suited for use with cryogenically cooled and also superconducting RO resonators. The completely electrically operable control of tuning and matching is of great advantage in this case, since the mechanical access to cryogenic systems during operation is generally highly limited (e.g. access to trimmers). Cryogenic temperatures in this connection are defined as temperatures below 100 K, in particular around 77 K (=LN2). However, lower temperatures are also possible, going down to 4.2 K (=LHe) at a reasonable expense. Any temperatures between these values are also standard and can be achieved with a corresponding cooling device (cryocooler). RO resonators of this type have very high quality factors, which have been unnecessarily strongly damped in the conventional circuits that have been used up to now, for which reason a considerable part of the Q value gain was lost again by electronic interfaces according to prior art. The inventive electronic interface avoids this problem in an elegant and effective fashion and permits realization of practical and highly efficient arrangements with cryogenic or also superconducting RO resonators. The electronic interface is thereby also advantageously operated at cryogenic temperatures in order to further minimize electric losses and the undesired noise power that occurs in this connection.

LIST OF REFERENCES

[1] J. Wosik, K. Nesteruk, M. R. Kamel, F. Ip1, L. Xue, A. C. Wrigth, and F. W. Wehrli
"Cryogenic Varactor-Tuned 4-element Array and Cryostat for p-MRI of Trabecular Bone in the Distal Tibia"
Proc. Intl. Soc. Mag. Reson. Med. 16 (2008)

[2] B. L. Beck, S. Wu, W. J. Turner, R. Bashirullah, and T. H. Mareci
"High Q Reactive Network for Automatic Impedance Matching" Proc. Intl. Soc. Mag. Reson. Med. 19 (2011)

[3] EP 0 315 382 A2

[4] P. B. Roemer, W. A. Edelstein, C. E. Hayes, S. P. Souza, 0. M. Mueller "The NMR Phased Array"
Magnetic Resonance in Medicine 16, 192-225 (1990)

[5] U.S. Pat. No. 6,850,067 B1

We claim:

1. An electronic interface between an NMR receiver resonator and at least one preamplifier, the NMR receiver resonator being designed as a receive-only resonator for receiving NMR signals emitted from a sample in response to irradiation of that sample with radio frequency radiation generated by a separate transmitter during a transmitting process, the electronic interface comprising:
at least one switching diode, said at least one switching diode being disposed, structured and dimensioned to open or detune the NMR receiver resonator during the transmitting process; and
at least one control diode, said control diode being structured to facilitate feeding of current through said control diode and into said switching diode during the transmitting process, thereby opening or detuning the NMR receiver resonator, wherein said control diode is directly connected to said switching diode or is connected to said switching diode via at least one series impedance, the interface thereby being structured for transforming an impedance of the NMR receiver resonator to the preamplifier during a receiving process and for opening or detuning the NMR receiver resonator during the transmitting process.

2. The device of claim 1, wherein at least one switching diode is a PIN diode.

3. The device of claim 1, wherein at least one control diode is a varactor diode, said varactor diode connected to conduct during the transmitting process and to act as a capacitance during the receiving process.

4. The device of claim 3, wherein at least one varactor diode is disposed, structured and dimensioned for matching.

5. The device of claim 3, wherein at least one varactor diode is disposed, structured and dimensioned for tuning.

6. The device of claim 1, further comprising at least one further protective diode connected anti-parallel with at least one switching diode.

7. The device of claim 1, wherein the device is symmetrically designed with two signal outputs, wherein an electronic interface circuit is provided twice with all diodes of a second circuit part having reverse polarity.

8. The device of claim 7, wherein at least one series connected identical electronic component of the circuit is replaced by one single of those components, thereby omitting a ground connection.

9. The device of claim 7, wherein one preamplifier is provided for each signal output.

10. The device of claim 7, wherein said two signal outputs are designed to combine signals in a phase-correct fashion and to guide those signals to only one preamplifier.

11. The device of claim 7, wherein varactor diodes and/or tuning diodes are multiplied by parallel or anti-parallel circuits.

12. The device of claim 1, wherein the device is structured for operation at temperatures below 100K.

\* \* \* \* \*